(12) United States Patent
Tseng

(10) Patent No.: US 7,940,136 B2
(45) Date of Patent: May 10, 2011

(54) OSCILLATOR

(75) Inventor: Kuan-Jen Tseng, Sinshih Township, Tainan County (TW)

(73) Assignee: Himax Analogic, Inc., Sinshih Township, Tainan County (TW)

(*) Notice: Subject to any disclaimer, the term of this patent is extended or adjusted under 35 U.S.C. 154(b) by 84 days.

(21) Appl. No.: 12/577,951

(22) Filed: Oct. 13, 2009

(65) Prior Publication Data

US 2011/0084770 A1    Apr. 14, 2011

(51) Int. Cl.
    *H03K 3/02*    (2006.01)
(52) U.S. Cl. .......................................... 331/111; 327/182
(58) Field of Classification Search ................. 331/111, 331/143, 150; 327/182
    See application file for complete search history.

(56) References Cited

U.S. PATENT DOCUMENTS

| | | | | |
|---|---|---|---|---|
| 6,028,492 A * | 2/2000 | Matsubara | ..................... | 331/111 |
| 6,362,697 B1 * | 3/2002 | Pulvirenti | ..................... | 331/111 |
| 6,600,379 B2 * | 7/2003 | Anderson | ................. | 331/113 R |
| 7,280,000 B2 * | 10/2007 | Daniel | ......................... | 331/143 |
| 2010/0066457 A1 * | 3/2010 | Muller | ......................... | 331/111 |

* cited by examiner

*Primary Examiner* — Levi Gannon
(74) *Attorney, Agent, or Firm* — Thomas, Kayden, Horstemeyer & Risley, LLP

(57) ABSTRACT

An oscillator is provided. The oscillator comprises a flip-flop module, a first and a second setting module. The first setting module comprises: a first switch device to generates a first switch signal according to a first oscillating signal, an NMOS and an inverter. The NMOS comprises a drain to receive a first charging current and a gate to receive the first switch signal, wherein the drain is charged or discharged according to the first switch signal. The inverter is connected to the drain to generate a first setting signal. The second setting module comprises a second switch device to generate a second switch signal according to a second oscillating signal and a comparator to generate a second setting signal according to the second switch signal and a reference voltage. The flip-flop module generates the first and the second oscillating signal according to the first and the second setting signal.

8 Claims, 2 Drawing Sheets

OSCILLATOR

BACKGROUND

1. Technical Field

The present disclosure relates to an electronic circuit. More particularly, the present disclosure relates to an oscillator.

2. Description of Related Art

Oscillator is an important electronic circuit to provide an oscillating signal. The definition of the duty cycle is the fraction of time that the oscillating signal is in an "active" state. For example, if both the active period and the inactive period of the oscillating signal is 1 ms, the duty cycle is 1/(1+1)=0.5.

However, the scale of the electronic device becomes smaller, and the operation frequency of the electronic circuit becomes higher. In order to maintain the precision of the oscillator circuit in such a high frequency circumstance, the architecture of the oscillator circuit becomes more complex and takes larger area to implement. However, the oscillator may become slower if the architecture of the oscillator becomes more complex. Therefore, there is a precision-speed tradeoff of the circuit. If the precision is maintained, the complexity of the circuit may generate a slower switching event. Nevertheless, in some applications, the duty cycle of the oscillator can be over 0.8, or even over 0.9. Under the extremely high frequency circumstance, the inactive period is very short. The difference between the duty cycle of 0.92 and the duty cycle of 0.94 is not very obvious. Thus, the precision can be sacrificed under the extremely high frequency circumstance.

Thus, what is needed is an oscillator to have a simpler architecture to provide a fast switching activity. The present disclosure addresses such a need.

SUMMARY

An oscillator is provided. The oscillator comprises a first setting module, a second setting module and a flip-flop module. The first setting module comprises: a first switch device, an NMOS and an inverter. The first switch device is to generate a first switch signal according to a first oscillating signal. The NMOS comprises a drain to receive a first charging current and a gate to receive the first switch signal, wherein the drain is charged when the gate is not turned on by the first switch signal and is discharged when the gate is turned on by the first switch signal. The inverter is connected to the drain to generate a first setting signal. The second setting module comprises a second switch device and a comparator. The second switch device is to generate a second switch signal according to a second oscillating signal. The comparator is to receive the second switch signal and a reference voltage to generate a second setting signal, wherein the second setting signal goes high when the voltage of the second switch signal is higher than the reference voltage and goes low when the voltage of the second switch signal is lower than the reference voltage. The flip-flop module is to generate the first and the second oscillating signal according to the first and the second setting signal, wherein when the first setting signal is high, the first oscillating signal is high and the second oscillating signal is low, when the second setting signal is high, the first oscillating signal is low and the second oscillating signal is high.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
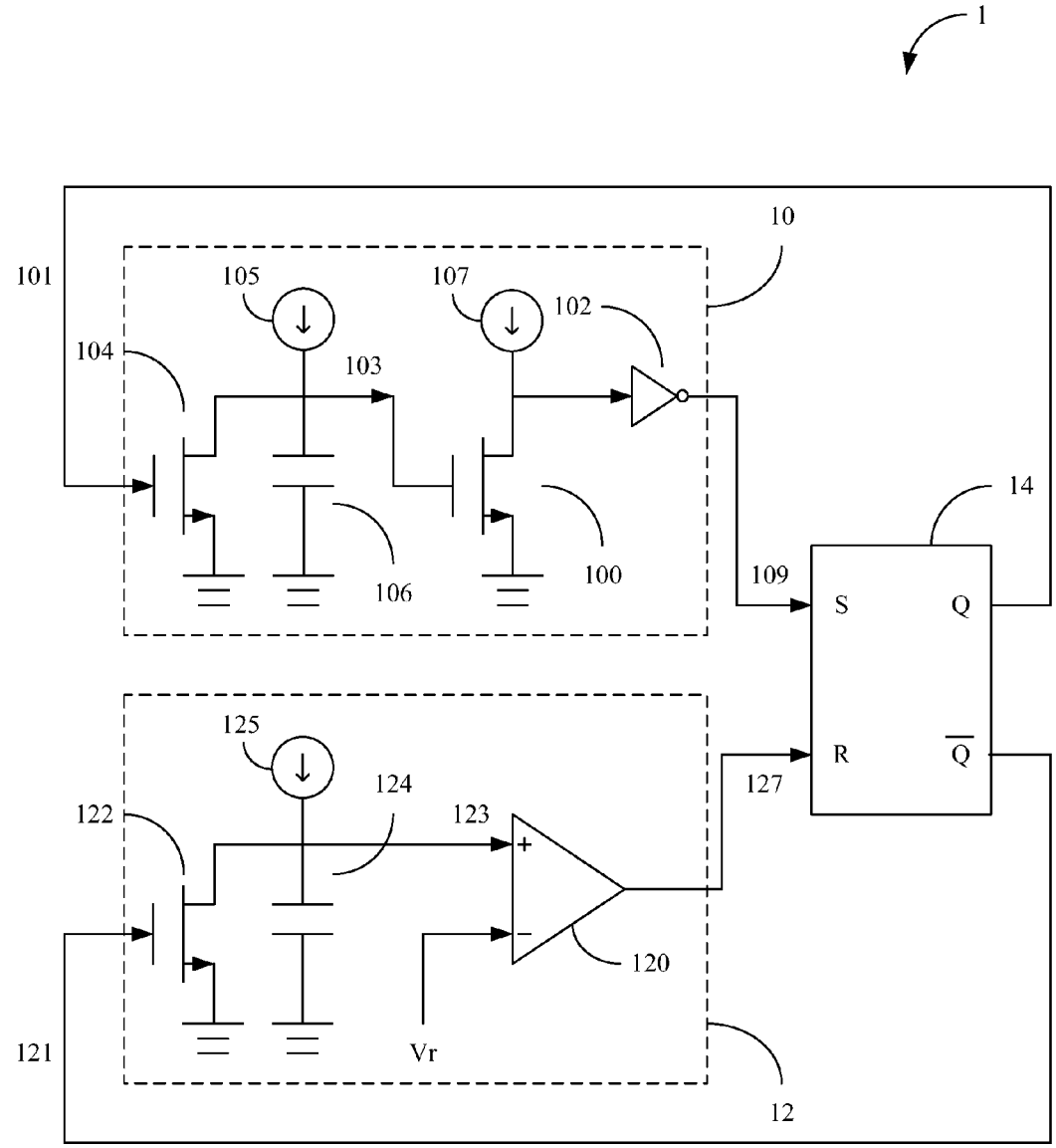
FIG. 1 is an oscillator of an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Please refer to FIG. 1. FIG. 1 is an oscillator 1 of an embodiment of the present disclosure. The oscillator 1 comprises a first setting module 10, a second setting module 12 and a flip-flop module 14.

The first setting module 10 comprises a first switch device, an NMOS 100 and an inverter 102. The first switch device in the present embodiment comprises an NMOS switch 104 and a capacitor 106. The gate of the NMOS switch 104 is to receive a first oscillating signal 101, and the drain of the NMOS switch 104 is to generate a first switch signal 103. The capacitor 106 is connected to the drain of the NMOS switch 104 to receive a second charging current 105, wherein the capacitor 106 is charged when the gate of NMOS switch 104 is not turned on by the first oscillating signal 101 and is discharged when the gate of NMOS switch 104 is turned on by the first oscillating signal 101. Therefore, the first switch signal 103 will gradually increase when the capacitor 106 is charged and will gradually decrease when the capacitor 106 is discharged according to the first oscillating signal 101.

The drain of the NMOS 100 is to receive a first charging current 107. The gate of the NMOS 100 is to receive the first switch signal 103, wherein the drain is charged when the gate is not turned on by the first switch signal 103 and is discharged when the gate is turned on by the first switch signal 103. The inverter 102 is connected to the drain of the NMOS 100 to generate a first setting signal 109. Therefore, the first setting signal 109 maintains a high level of voltage when the first switch signal 103 is beyond the threshold voltage of the NMOS 100 and turns low when the first switch signal 103 is below the threshold voltage of the NMOS 100.

The second setting module 12 comprises a second switch device and a comparator 120. The second switch device in the present embodiment comprises an NMOS switch 122 and a capacitor 124. The gate of the NMOS switch 122 is to receive a second oscillating signal 121, and the drain of the NMOS switch 122 is to generate a second switch signal 123. The capacitor 124 is connected to the drain of the NMOS switch 122 to receive a third charging current 125, wherein the capacitor 124 is charged when the gate of NMOS switch 122 is not turned on by the second oscillating signal 121 and is discharged when the gate of NMOS switch 122 is turned on by the second oscillating signal 121. Therefore, the second switch signal 123 will gradually increase when the capacitor 124 is charged and will gradually decrease when the capacitor 124 is discharged according to the second oscillating signal 121.

The comparator 120 is to receive the second switch signal 123 and a reference voltage Vr to generate a second setting signal 127, wherein the second setting signal 127 goes high when the voltage of the second switch signal 123 is higher than the reference voltage Vr and goes low when the voltage of the second switch signal 123 is lower than the reference voltage Vr. In an embodiment, the reference voltage is 0.5 V. However, in other embodiments of different applications, the reference voltage can be set to other values.

The flip-flop module 14 in the present embodiment is a SR flip-flop 14 comprising a set end and a reset end labeled as S and R respectively in FIG. 1. The set end of the flip-flop module 14 receives the first setting signal 109, and the reset end receives the second setting signal 127. The SR flip-flop 14 further comprises two outputs labeled as Q and Q bar respectively in FIG. 1. The output Q generates the first oscillating signal 101 and the output Q bar generates the second oscillating signal 121 respectively according to the first and the second setting signals 109 and 127. Due to the characteristic of the SR flip-flop 14, when the first setting signal 109 (set) is high, the output Q, i.e. the first oscillating signal 101 is high and the output Q bar, i.e. the second oscillating signal 127 is low. When the second setting signal 127 (reset) is high, the output Q, i.e. the first oscillating signal 101 is low and the output Q bar, i.e. the second oscillating signal 127 is high.

Figure 2:
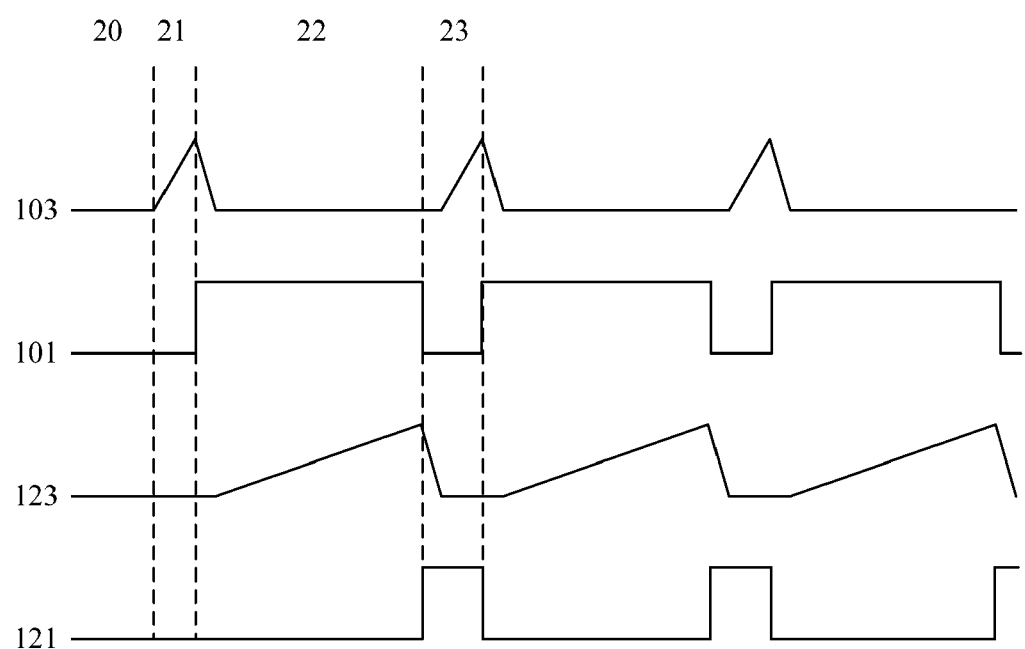
FIG. 2 is a diagram of the waveforms of the first switch signal, the first oscillating signal, the second switch signal and the second oscillating signal.

In order to give a more detailed description of the operation of the oscillator 1, please refer to FIG. 2. FIG. 2 is a diagram of the waveforms of the first switch signal 103, the first oscillating signal 101, the second switch signal 123 and the second oscillating signal 121. The initial condition of the oscillator 1 is depicted in time slot 20 of FIG. 2. The first oscillating signal 101 is at low level, which is not able to turn the gate of the NMOS switch 104 on. Thus, the second charging current 105 starts to charge the capacitor 106. The capacitor 106 is designed to have a fast charging and discharging ability. Therefore, the capacitor 106 is quickly charged to a level equal to the threshold voltage of the NMOS 100 in time slot 21 to turn on the NMOS 100.

The NMOS 100 has a fast discharging ability. Therefore, the voltage of the drain of the NMOS 100 decreases rapidly to become a low level. The first setting signal 109, i.e. the output of the inverter 102 connected to the drain of the NMOS 100, thus become a high level to set the flip-flop module 14. Therefore, the first oscillating signal 101 becomes high, depicted in time slot 22 of FIG. 2. The first oscillating signal 101 further turns on the gate of the NMOS switch 104 to make the capacitor 106 discharges. The level of the first switch signal 103 thus drops and becomes unable to turn on the NMOS 100. The first charging current 107 therefore starts to charge the drain of the NMOS 100.

The high level of the first setting signal 109 simultaneously makes the second oscillating signal 121 becomes low. The NMOS switch 122 thus turns off by the second oscillating signal 121 to make the capacitor 124 receives the third charging current 125. The capacitor 124 is designed to have a low charging ability. Therefore the second switching signal 123 increases slowly, depicted in time slot 22 of FIG. 2. When the second switching signal 123 become larger than the reference voltage Vr, the second setting signal 127, i.e. the output of the comparator 120 becomes a high level. Thus, the high level of the second setting signal 127 makes the second oscillating signal 121 becomes high, depicted in time slot 23 of FIG. 2.

The high level of the second setting signal 127 simultaneously makes the first oscillating signal 101 switch to a low level, also depicted in time slot 23 in FIG. 2. The low level of the first oscillating signal 101 is not able to turn the gate of the NMOS switch 104 on. Thus, the second charging current 105 starts to charge the capacitor 106 again to repeat the above procedure from time slot 21 to time slot 22. The repeating procedure makes the first and the second oscillating signal 101 and 121 oscillate to provide two complement oscillating signals.

The precision of the second setting module 12 is substantially better than the first setting module 10, since the comparator is much more accurate than a single NMOS. It's possible to make use of a symmetrical structure to connect both the inputs of the flip-flop module 14 with the second setting module 12 to maintain the precision. However, the architecture of the comparator 120 in the second setting module 12 is complex and the area of the comparator 120 is much larger than a single NMOS, which is an undesirable cost.

In some applications, the duty cycle of the oscillating signal is over 0.8, or even over 0.9. Under the high frequency circumstance, the inactive period of the oscillating signal with such a duty cycle is extremely short. The difference between the inactive periods of the oscillating signals with the duty cycle such as 0.92 and 0.94 is not obvious. The precision can be sacrificed under the extremely high frequency circumstance. Therefore, the first oscillating signal 101 can provide an oscillating signal with an extremely high duty cycle. The oscillator of the present disclosure provides a setting module (the first setting module) with high speed and small area comprising only a first switch device and a single NMOS. Though the accuracy of the first setting module 10 is not high, it is acceptable in a high frequency circumstance.

It's noticed that in another embodiment, the first and the second setting modules 10 and 12 can be interchanged to be connected to the reset end and the set end of the flip-flop module 14 respectively. When the first and the second setting modules 10 and 12 are connected to the reset end and the set end respectively, the first oscillating signal 101 is generated at the output Q bar of the SR flip-flop 14.

In other embodiments, the type of the flip-flop module 14 can be different. Also, the capacitors and the charging current used in each of the first and the second setting modules 10 and 12 can be adjusted to control the frequency of the oscillating signal and the duration of the active and the inactive period. Those skilled in the art can easily make various modifications and variations.

The present disclosure provides an oscillator having a simpler architecture with smaller area to provide a fast switching activity.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An oscillator comprising:
   a first setting module comprising:
      a first switch device to generate a first switch signal according to a first oscillating signal;
      an NMOS comprising a drain to receive a first charging current and a gate to receive the first switch signal, wherein the drain is charged when the gate is not turned on by the first switch signal and is discharged when the gate is turned on by the first switch signal; and
      an inverter connected to the drain to generate a first setting signal;
   a second setting module comprising:
      a second switch device to generate a second switch signal according to a second oscillating signal; and a comparator to receive the second switch signal and a reference voltage to generate a second setting signal, wherein the second setting signal goes high when the voltage of the second switch signal is higher than the reference voltage and goes low when the voltage of the second switch signal is lower than the reference voltage; and a flip-flop module to generate the first and the second oscillating signal according to the first and the second setting signal, wherein when the first setting signal is high, the first oscillating signal is high and the second oscillating signal is low, when the second setting signal is high, the first oscillating signal is low and the second oscillating signal is high.

2. The oscillator of claim 1, wherein the flip-flop module is a SR flip-flop comprising a set end to receive the first setting signal and a reset end to receive the second setting signal.

3. The oscillator of claim 1, wherein the flip-flop module is a SR flip-flop comprising a reset end to receive the first setting signal and a set end to receive the second setting signal.

4. The oscillator of claim 1, wherein the first switch device comprising:

an NMOS switch comprising a gate to receive the first oscillating signal and a drain to generate the first switch signal; and a capacitor connected to the drain of the NMOS switch to receive a second charging current, wherein the capacitor is charged when the gate of NMOS switch is not turned on by the first oscillating signal and is discharged when the gate of NMOS switch is turned on by the first oscillating signal.

5. The oscillator of claim 1, wherein the second switch device comprising:

an NMOS switch comprising a gate to receive the second oscillating signal and a drain to generate the second switch signal; and a capacitor connected to the drain of the NMOS to receive a third charging current, wherein the capacitor is charged when the gate of NMOS switch is not turned on by the second oscillating signal and is discharged when the gate of NMOS switch is turned on by the second oscillating signal.

6. The oscillator of claim 1, wherein the duty cycle of the first oscillating signal is over 0.8.

7. The oscillator of claim 1, wherein the duty cycle of the first oscillating signal is over 0.9.

8. The oscillator of claim 1, wherein the reference voltage is 0.5 V.

* * * * *